US012422615B2

(12) United States Patent
Pietambaram et al.

(10) Patent No.: US 12,422,615 B2
(45) Date of Patent: Sep. 23, 2025

(54) NESTED GLASS PACKAGING ARCHITECTURE FOR HYBRID ELECTRICAL AND OPTICAL COMMUNICATION DEVICES

(71) Applicant: Intel Corporation, Santa Clara, CA (US)

(72) Inventors: Srinivas V. Pietambaram, Chandler, AZ (US); Brandon C. Marin, Chandler, AZ (US); Debendra Mallik, Chandler, AZ (US); Tarek A. Ibrahim, Mesa, AZ (US); Jeremy Ecton, Gilbert, AZ (US); Omkar G. Karhade, Chandler, AZ (US); Bharat Prasad Penmecha, Phoenix, AZ (US); Xiaoqian Li, Chandler, AZ (US); Nitin A. Deshpande, Chandler, AZ (US); Mitul Modi, Phoenix, AZ (US); Bai Nie, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 842 days.

(21) Appl. No.: 17/473,694

(22) Filed: Sep. 13, 2021

(65) Prior Publication Data
US 2023/0080454 A1 Mar. 16, 2023

(51) Int. Cl.
*G02B 6/12* (2006.01)
*H01L 23/48* (2006.01)

(52) U.S. Cl.
CPC ........ *G02B 6/12004* (2013.01); *H01L 23/481* (2013.01); *G02B 2006/12038* (2013.01);
(Continued)

(58) Field of Classification Search
CPC .................................................. G02B 6/12002
See application file for complete search history.

(56) References Cited

U.S. PATENT DOCUMENTS

| 6,454,470 B1 * | 9/2002 | Dwarkin | G02B 6/4214 |
| | | | 385/33 |
| 10,199,326 B1 * | 2/2019 | Ohsaki | H01L 27/0694 |

(Continued)

OTHER PUBLICATIONS

Huang, Huan et al., "Femtosecond fiber laser direct writing of optical waveguide in glasses", SPIE 8164, Nanophotonics and Macrophotonics for Space Environments V, 81640B (Aug. 31, 2011), 8 pages.

(Continued)

*Primary Examiner* — Charlie Y Peng
(74) *Attorney, Agent, or Firm* — Akona IP PC

(57) ABSTRACT

An optoelectronic assembly is disclosed, comprising a substrate having a core comprised of glass, and a photonic integrated circuit (PIC) and an electronic IC (EIC) coupled to a first side of the substrate. The core comprises a waveguide with a first endpoint proximate to the first side and a second endpoint exposed on a second side of the substrate orthogonal to the first side. The first endpoint of the waveguide is on a third side of the core parallel to the first side of the substrate. The substrate further comprises an optical via aligned with the first endpoint, and the optical via extends between the first side and the third side. In various embodiments, the waveguide is of any shape that can be inscribed by a laser between the first endpoint and the second endpoint.

11 Claims, 7 Drawing Sheets

(52) U.S. Cl.
CPC .............. *G02B 2006/12102* (2013.01); *G02B 2006/12121* (2013.01)

(56) References Cited

U.S. PATENT DOCUMENTS

| | | | |
|---|---|---|---|
| 10,224,286 B1 * | 3/2019 | England | H01L 24/05 |
| 11,076,491 B2 * | 7/2021 | Pun | H05K 3/361 |
| 2010/0232744 A1 | 9/2010 | Asai et al. | |
| 2014/0056554 A1 | 2/2014 | Brunner et al. | |
| 2018/0246279 A1 | 8/2018 | Lohse et al. | |
| 2020/0411587 A1 * | 12/2020 | Pezeshki | H01L 25/167 |
| 2021/0120680 A1 | 4/2021 | Pun et al. | |
| 2021/0173160 A1 | 6/2021 | Patra et al. | |

OTHER PUBLICATIONS

Hutt, David A. et al., "Glass as a Substrate for High Density Interconnects", Wolfson School of Mechanical and Manufacturing Engineering, Loughborough University, Loughborough, United Kingdom, retrieved from https://www.boro.ac.uk on Sep. 1, 2021, 28 pages.

Khalil, Alain Abou et al., "Direct laser writing of a new type of waveguides in silver containing glasses", Sci Rep 7, 11124 (2017), pp. 1-9.

Shorey, Aric B. et al., "Thin Glass Substrates with Through-Glass Vias: Fabrication and Application to Millimeter Wave Antennas", International Symposium on Microelectronics Oct. 1, 2019, 4 pages.

Tehrani, Bijan K. et al., "Substrate-Independent System-on-Package Antenna Integration with Inkjet Printing",2016 IEEE International Symposium on Antennas and Propagation (APSURSI), 2016, pp. 827-828.

\* cited by examiner

NESTED GLASS PACKAGING ARCHITECTURE FOR HYBRID ELECTRICAL AND OPTICAL COMMUNICATION DEVICES

TECHNICAL FIELD

The present disclosure relates to techniques, methods, and apparatus directed to nested glass packaging architecture for hybrid electrical and optical communication devices.

BACKGROUND

Electronic circuits when fabricated on a wafer of semiconductor material, such as silicon, are commonly called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system. Some ICs have specific functionalities, such as memory or processing. Some other ICs have multiple functionalities, such as a system-on-chip (SOC), in which all or most components of a computer or other electronic system are integrated into a single monolithic die. Yet other ICs have optical functionalities integrated therein; such an IC is called a photonic integrated circuit (PIC).

PICs operate with electromagnetic signals in the visible and/or near infrared region of the electromagnetic spectrum (e.g., 850 nanometer wavelength and beyond). PICs and SOCs are typically used in contemporary communication systems, biomedical applications and/or photonic computing. In such optical communications, information is transmitted by way of an optical carrier whose frequency typically is in the visible and/or near-infrared region of the electromagnetic spectrum. A carrier with such a high frequency is sometimes referred to as an optical signal, an optical carrier, a light wave signal, or simply light. A typical optical communications network includes several optical fibers, each of which may accommodate several channels. A channel is a specified frequency band of an electromagnetic signal and is sometimes referred to as having a center or characteristic wavelength. Technological advances today enable implementing portions of optical communication systems at the IC (or chip or die) level in PICs.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1A:
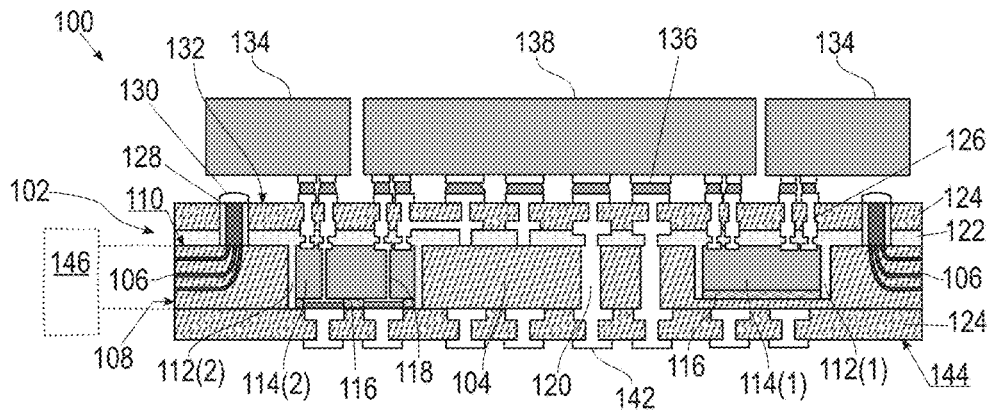
FIG. 1A is a simplified cross-sectional view of an example packaging architecture for hybrid electrical and optical communication devices, according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in a way that limits the broad scope of the present disclosure and its potential applications.

In a general sense, a PIC integrates photonic functions for information signals imposed on electromagnetic waves, e.g., electromagnetic waves of optical wavelengths. PICs find application in fiber-optic communication, medical, security, sensing, and photonic computing systems. The PIC may implement one or more optical and electro-optical devices such as lasers, photodetectors, waveguides, and modulators on a single semiconductor chip. In addition, the PIC may also include electrical circuitry to process electrical signals corresponding to these optical signals. Such integrated PICs can enable a cost-effective solution for optical communication and optical interconnects.

Among the challenges in packaging a PIC is a need for parallel tight-pitch interconnects that enable high-density, high-bandwidth electrical communication between the PIC and other electrical devices, such as electronic integrated circuits (EICs) (e.g., ICs that work with electrical signals as opposed to optical signals) with simultaneous optical access to the PIC for the optical signals. Indeed, getting optical signals into and out of PICs is a driver of manufacturing cost and complexity. In addition, coupling a fiber-optic cable, also sometimes referred to as "optical fiber" or, simply, a "fiber," to a PIC so that electromagnetic signals, e.g., optical signals, may be exchanged between the two is challenging. One way to couple a PIC to a fiber is to implement edge-coupling by using an intermediate optical coupling structure (OCS) (sometimes referred to as "fiber array unit"

(FAU)) that has one end coupled to a fiber and an opposite end placed proximate to a PIC die so that electromagnetic signals may be exchanged between the PIC and the fiber via the OCS.

In hybrid electrical and optical communications devices having both PICs and EICs in a single integrated package, advanced three-dimensional interconnect technology typically used in packaging EICs cannot be used easily because of the inherent inability of optical signals to traverse opaque materials such as polymers and epoxies used in advanced packages. Further waveguides are difficult to form accurately in organic materials having undulated surfaces. As used herein, a "waveguide" is a structure that guides electromagnetic waves (typically in the near infrared spectrum) along a particular direction. Hence, there is a need to modify such packaging architecture used for EICs to accommodate PICs suitably.

It is generally known that waveguides may be accurately fabricated in glass using lithography or laser scribing. In particular, a technique called direct laser writing (DLW) can be used to generate waveguides with three-dimensional (3D) structures within glass. In one example of DLW, femtosecond laser pulses are focused inside a transparent glass substrate, resulting in permanent, smooth, and isotropic change in the refractive index. The laser pulses are tightly focused inside the bulk transparent glass (for example, through non-linear absorption by photoionization and avalanche ionization), and this locally deposited energy in the small volume around the focus can induce local modification of refractive index by a variety of mechanisms. For example, the change in refractive index may be caused by the formation of color centers, and/or the change of the glass density from local heating during laser passage and subsequent glass restructuration during cooling. Compared with traditional fabrication techniques, DLW has a number of advantages in waveguide fabrication. For example, it is simple, cost-effective, and capable of wide variety of material processing and "at will" structure writing. This DLW technique allows fabrication of complex circuits and three-dimensional optical waveguide structures inside transparent materials that are otherwise impossible with traditional fabrication methods, which produce only structures in planar geometry.

In one example processing method known in the art, two different regimes of femtosecond waveguide writing can exist depending on whether a pulse gap between successive laser pulses is longer or shorter than thermal diffusion time of the bulk glass: (1) low repetition rate regime, in which material modification is produced by individual pulses and processing speed is relatively slow; and (2) high repetition rate regime, in which time between successive pulses is shorter than the thermal diffusion time, resulting in heat accumulation in the focal volume during laser processing. In general, as the laser scans through the bulk glass, material first melts under the laser's energy, and then as the laser passes on, this molten material cools from the outside in, resulting in a smooth permanent refractive index change. In some cases where isotropic heat diffusion occurs, this process results in faster processing speed and symmetric cross section. Since thermal diffusion time in the glass is about 1 microsecond, the transition between the two regimes takes place at a repetition rate around 1 MHz.

In one aspect of the present disclosure, an example nested glass packaging architecture for hybrid electrical and optical communication devices includes an optoelectronic assembly with at least one PIC and one EIC coupled to a substrate having a glass core having three-dimensional waveguide structures formed therein. The substrate further includes one or more through-glass-via (TGV) that permits electrical coupling between two opposing faces of the substrate. In some embodiments, the substrate may include a cavity in which another IC die is situated, for example, to provide high-density interconnect bridging between the PIC and the EIC.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are stated in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a semiconductor-on-insulator (SOI, e.g., a silicon-on-insulator) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of input/output (I/O) functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "optical structure" includes arrangements of forms fabricated in ICs to receive, transform and/or transmit optical signals as described herein. It may include optical conductors such as waveguides, electromagnetic radiation sources such as lasers and light-emitting diodes (LEDs) and electro-optical devices such as photodetectors.

In various embodiments, any PIC described herein may comprise a semiconductor material including, for example, N-type or P-type materials. The PIC may include, for example, a crystalline base material formed using a bulk silicon (or other bulk semiconductor material) or a SOI structure (or, in general, a semiconductor-on-insulator structure). In some embodiments, the PIC may be formed using alternative materials, which may or may not be combined with silicon, that include, but are not limited to, lithium niobite, indium phosphide, silicon dioxide, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, the PIC may comprise a non-crystalline material, such as polymers. In some embodiments, the PIC may be formed on a printed circuit board (PCB). In some embodiments, the PIC may be inhomogeneous, including a carrier material (such as glass or silicon carbide) as a base material with a thin semiconductor layer over which is an active side comprising transistors and like components. Although a few examples of the material for the PIC are described here, any material or structure that may serve as a foundation upon which the PIC may be built falls within the spirit and scope of the present disclosure.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., metal oxide semiconductor (MOS) FETs (MOSFETs). In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals (in addition to electrical signals), such as a PIC, "interconnect" may also describe any element formed of a material that is optically conductive for providing optical connectivity to one or more elements associated with the PIC. In such cases, the term "interconnect" may refer to any element that provides a suitable optical pathway, including optical waveguides (e.g., structures that guide and confine light waves), optical fibers, optical splitters, optical combiners, optical couplers, and optical vias.

The term "conductive trace" may be used to describe an electrically conductive element (e.g., planes, pads, lines, etc.) isolated by an insulating material. Within IC dies, such insulating material comprises interlayer low-k dielectric that is provided within the IC die. Within package substrates, and PCBs such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "metallization stack" may be used to refer to a stack of one or more interconnects for providing connectivity to different circuit components of an IC die/chip and/or a package substrate.

In context of a stack of dies coupled to one another or in context of a die coupled to a package substrate, the term "interconnect" may also refer to, respectively, die-to-die (DTD) interconnects and die-to-package substrate (DTPS) interconnects.

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be unpackaged bare dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

As used herein, the term "pitch" refers to a center-to-center distance (e.g., a sum of width and spacing) between adjacent interconnects.

In microelectronic assemblies or IC packages as described herein, some or all of the DTD interconnects may have a finer pitch than the DTPS interconnects. In some embodiments, the DTPS interconnects disclosed herein may have a pitch between about 80 micrometer and 300 micrometer, while the DTD interconnects disclosed herein may have a pitch between about 0.7 micrometer and 100 micrometer. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photo-imageable.

The terms "substantially," "close," "approximately," "near," and "about," generally refer to being within +/−20% of a target value (e.g., within +/−5 or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale. In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 110a-110e), such a collection may be referred to herein without the letters (e.g., as "110").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1A is a schematic cross-sectional illustration of a portion of an optoelectronic assembly 100, according to some embodiments of the present disclosure. An example embodiment comprises a substrate 102 having a core 104. In various embodiments, a thickness of core 104 may be between 100 micrometer and 800 micrometer. Core 104 comprises bulk transparent glass, which is different from fiberglass (e.g., as in fiberglass reinforced epoxy cores typically used in package substrates or motherboards) and opaque polycrystalline ceramic glass (e.g., which are used in high-temperature applications). Moreover, in various embodiments, the glass is not combined with any organic material. In general, core 104 comprises any type of bulk transparent glass with appropriate refractive index, absorbance, transmittance, reflectivity, and other material properties suitable for optical communication, including fused silica, borosilicate glass, transparent ceramic glass, etc.

Substrate 102 may comprise a "patch" substrate, which refers to a dimensionally smaller sized package substrate and/or interposer. In a general sense, a typical package substrate known in the art provides mechanical support and electrical interface for one or more dies; it enables electrically coupling the dies to other dies and components of a larger electronic system through a mother board. The typical interposer, sandwiched between the package substrate and the dies within a package, has a similar footprint as the package substrate. The patch substrate is similar to the interposer in relative location sandwiched between the package substrate and the dies, but it has a smaller footprint. Several sub-assemblies of known-good dies on patch substrates may be coupled together on a single typical package substrate known in the art. For example, these multi-chip modules on the patch substrate may function together as a sub-component in the larger package, functioning as memory modules, or processing modules, for instance. In other words, a patch substrate is to a package substrate what the latter is to a motherboard in a typical electronic system. The patch substrate, for example, substrate 102, provides routing functionalities generally, and in some embodiments, additional processing capabilities as described herein.

A portion of core 104 may comprise one or more waveguides, for example waveguide 106. Waveguide 106 may include any appropriate component configured to feed, or launch, electromagnetic waves into a suitable medium of propagation such as an optical fiber. In various embodiments, waveguide 106 comprises non-planar, non-linear waveguides configured to guide electromagnetic radiation of any wavelength bands from about 0.8 micrometer to about 5 centimeter. In some embodiments, waveguide 106 may support wavelengths from about 1.2 micrometer to about 1.7 micrometer in the near-infrared and infrared bands for use in data communications and telecommunications. In other embodiments, waveguide 106 may support wavelengths from about 1 millimeter to about 10 millimeter extremely high frequency (EHF) band of radio/micro-waves), and in particular, wavelengths of about 2 millimeter may be used for radar and radio frequency (RF) wireless communications.

Figure 1B:
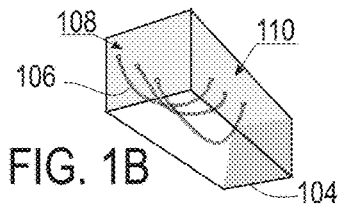
FIG. 1B is a simplified perspective view of details of the example packaging architecture of FIG. 1A, according to some embodiments of the present disclosure.

In an example embodiment, waveguide 106 may be fabricated using DLW processes known in the art. In example embodiments, waveguide 106 may have a thickness of around 5 micron to 50 micron. Waveguide 106 may be shaped (e.g., curved, bent, etc.) such that one end is along an exposed side 108 of core 104 and another end is on another side 110 of core 104 orthogonal to side 108. Multiple ones of waveguide 106 are shown in greater detail in FIG. 1B, which is a simplified perspective view of a portion of core 104. As shown therein, waveguide 106 may be of any suitable three-dimensional shape and situated between side 108 and side 110 within core 104. In various embodiments, waveguide 106 may present as grooves, lines, local deformations in glass, or other structural forms, differentiated from the rest of core 104 by its different refractive index. The specific contours of waveguide 106 may vary with the DLW process, for example, based on laser pulse properties, such as power, wavelength, pulse time, and speed of writing.

During operation, the curved waveguide 106 may bend (e.g., reroute) incoming optical signals suitably between orthogonal sides 108 and 110. Thus, waveguide 106 functions differently from FAUs or other optical fiber assemblies having 90 degree turns in the optical fibers by locating the orthogonal turn within the body of substrate 102, thereby removing any need for external components having such functionality. Waveguide 106 also differs from conventional planar waveguides typically fabricated on surfaces of optical or optoelectronic components by having a complex, non-linear, three-dimensional form (e.g., shape, structure) through the bulk glass of core 104. Waveguide 106 also functions differently from units that use a grating to reroute optical signals orthogonally by performing the rerouting in situ within substrate 102 without added components. In various embodiments, waveguide 106 fabricated with this three-dimensional form (e.g., shape, structure) within core 104, using DLW processes for instance, can enable simpler, faster, more compact, low-cost, compatible assembly, and in some cases, more reliable connections with optoelectronic systems.

Returning to FIG. 1A, in the example embodiment shown, core 104 may comprise a cavity 112 in which is located one or more IC die 114 attached to core 104 with a suitable adhesive 116. In various embodiments, adhesive 116 may comprise an industry-standard die attach material, such as liquid epoxy or polyimide film. Cavity 112 may comprise a blind cavity or a through-hole cavity, which may be used for correspondingly different types of IC die 114 inserted therein. For example, IC die 114(1), located in blind cavity 112(1), may function as a bridge die providing high-density electrical interconnection between lateral components located on one side of substrate 102, as in a 2.5D packaging architecture. IC die 114(2), located in through-cavity 112(2), may include through-silicon-vias (TSVs) 118 enabling power, ground and signal connectivity to components located on either side of substrate 102 as in 3D packaging architecture, in addition to high-density electrical interconnection between lateral components located on the same side of substrate 102 as in 2.5D packaging architecture. In some embodiments, IC die 114 may comprise only passive elements, for example, conductive traces and vias with resistors and capacitors fabricated in metallization layers with interlayer dielectric (ILD) over a silicon substrate; in other embodiments, IC die 114 may comprise active elements also, including transistors, diodes, and the like. The choice of using active elements in IC die 114 may vary depending on desired functionalities, performance, cost and manufacturing considerations of optoelectronic assembly 100. IC die 114 may be any suitable IC fabricated on a semiconductor substrate within the broad scope of the present disclosure. TGVs 120 in core 104 may further enable power, ground and signal connectivity to components located on either side of substrate 102.

A first dielectric 122, for example, comprising ABF may encapsulate core 104 on side 110, filling in cavity 112 as appropriate, including any spaces around die 114 in cavity 112. A second dielectric 124 may be provided on either side of core 104. In some embodiments, second dielectric 124 may comprise the same material as first dielectric 122, for example, ABF. In other embodiments, second dielectric 124 may comprise materials different from first dielectric 122, for example, benzocyclobutene (BCB), cyclotene, polyimide, alkylthiophenes, diazoquinones, epoxy/phenol, acrylic, and/or polybenzoxazole (PBO). Conductive traces 126, including vias, planes and pads, may be provided on either side of core 104 in second dielectric 124 using any suitable conductive material, such as copper. In various embodiments, second dielectric 124 and conductive traces 126 may be formed as alternating layers with conductive vias through second dielectric 124 providing electrical coupling between metal layers. Dielectric 124 and conductive traces 126 on either side of core 104 thus differentiate substrate 102 from some glass substrates known in the art, in which such structures are not used, and instead, metallization is patterned directly on the glass itself. Conductive pads on exposed sides of second dielectric 124 may enable coupling to external interconnects as appropriate.

Because side 110 of core 104 where waveguide 106 terminates is not exposed to the outside for optical transmission purposes, one or more transparent optical via 128 may be provided in first dielectric 122 and second dielectric 124 aligned with the endpoints of waveguide 106 proximate to side 110. In an example embodiment, optical via 128 may be filled with transparent optical epoxy. A diameter of optical via 218 may be between 50 micrometer and 200 micrometer in various embodiments. In some embodiments, optical via 128 may be a single via; in other embodiments, each waveguide 106 may be associated with a separate optical via 128; in yet other embodiments, an array of optical vias, also called "optical via array" may function together as optical via 218.

An optical lens 130 of approximately similar diameter as optical via 128 may be attached on a side 132 of substrate 102 such that optical lens 130 is substantially aligned with optical via 128. In some embodiments, optical lens 130 may comprise a single optical lens; in other embodiments, optical lens 130 may comprise an array of multiple optical lens, also called "lens array." In various embodiments, optical via 128 extends between side 110 of core 104 and side 132 of substrate 102. Optical via 128 is configured to communicate optical signals between waveguide 106 and optical lens 130 suitably. Optical lens 130 may enable focusing optical signals through waveguide 106 and optical via 128 to one or more PIC 134 coupled to side 132 of substrate 102 with first-level interconnects (FLI) 136. In various embodiments, PIC 134 may comprise electromagnetic radiation sources (e.g., lasers, oscillators, light emitting diodes (LEDs)), polarizers, phase shifters, filters, multiplexers, attenuators, waveguides, and amplifiers in addition to active elements such as transistors and passive elements such as resistors and inductors. Waveguides in PIC 134 can guide optical signals and also perform coupling, switching, splitting, multiplexing and demultiplexing optical signals.

An EIC 138 may also be coupled to side 132 of substrate 102 with FLI 136. In some embodiments, EIC 138 may comprise an IC configured to electrically integrate with PIC 134 to achieve the intended functionalities of optoelectronic assembly 100. For example, EIC 138 may be a SOC or an Application Specific IC (ASIC), such as a switch circuit or driver/receiver circuit used in optical communication systems. EIC 138 may include various functions such as driving, processing, and cleaning signals from and to PIC 134, and providing the necessary voltage to PIC 134. In various embodiments, EIC 138 may comprise active components, including one or more transistors, voltage converters, trans-impedance amplifiers (TIA), clock and data recovery (CDR) components, microcontrollers, etc. configured to operate exclusively with electrical signals. EIC 138 may further include, or be a part of, one or more of a CPU, a memory device, e.g., a high-bandwidth memory device, a logic circuit, input/output circuitry, a transceiver such as a field programmable gate array transceiver, a gate array logic such as a field programmable gate array logic, of a power delivery circuitry, a III-V or a III-N device such as a III-N or III-N amplifier (e.g., GaN amplifier), Peripheral Component Interconnect Express (PCIe) circuitry, Double Data Rate transfer circuitry, or other electronic components known in the art.

In various embodiments, IC die 114(1) and/or 114(2) may enable lateral electrical connectivity between PIC 134 and EIC 138. In various embodiments, IC die 114 may function as a bridge die, providing high-density silicon-level interconnection between PIC 134 and EIC 138. An underfill or other material (not shown) that provides electrical insulation and mechanical stability and reliability may be optionally provided between substrate 102 and components coupled to side 132, for example, PIC 134, and EIC 138.

In various embodiments, mid-level interconnects (MLI) 142 on side 144 of substrate 102 opposite to side 132 may enable electrical and mechanical coupling of substrate 102 to other components, such as a larger interposer or package substrate. Note that in the figure, the form (e.g., shape, structure, etc.) of MLI 142 is not shown; only the conductive contacts (e.g., bond pads) to which MLI 142 is attached is indicated therein. The pitch (i.e., smallest spacing between two adjacent interconnects) of MLI 142 may be larger than or equal to the pitch of FLI 136. In embodiments where the pitch of MLI 142 is larger than the pitch of FLI 136, substrate 102 may also function as a redistribution layer (RDL), enabling fanning out interconnections from a finer pitch to a coarser pitch, thereby allowing cheaper package substrates or interposers manufactured with less advanced technologies to be coupled thereto.

In various embodiments, a size of substrate 102 (e.g., thickness and footprint) may vary according to a number of interconnections required laterally between PIC 134 and EIC 138 as also with a number of PIC 134 and EIC 138 coupled to substrate 102. For example, larger number of interconnections between PIC 134 and EIC 138 may lead to greater number of dielectric layers and metal layers constituting second dielectric 124 and conductive traces 126 in substrate 102. In another example, greater number of ICs coupled laterally on side 132 of substrate 102 may require a larger footprint of substrate 102 to accommodate all of them.

Note that an OCS 146 is shown coupled to substrate 102 on exposed side 108 only; however, in various embodiments, OCS 146 is coupled to substrate 102 on any exposed side where waveguide 106 terminate. In a general sense, OCS 146 comprises optical fibers and other components that enable receiving and transmitting optical signals in and out of optoelectronic assembly 100. OCS 146 may be any structure configured to optically couple a fiber-optic cable (or, simply, fiber) to substrate 104 so that optical signals may be exchanged between the fiber and substrate 102.

In various embodiments, IC die 114 and EIC 138 may comprise materials as described above with regard to IC dies in general, and PIC 134 may comprise materials as described above with regard to PICs in general. In various embodiments, FLI 136 and MLI 142 may comprise DTD interconnects as described above. Second-level interconnects (SLI) (not shown) between substrate 102 and a motherboard, for instance, may comprise DTPS interconnects as described above.

In general, the light provided to PIC 134 may include any electromagnetic signals having information encoded therein (or, phrased differently, any electromagnetic signals modulated to include information). Often times, the electromagnetic signals are signals associated with optical amplitudes, phases, and wavelengths and, therefore, descriptions provided herein refer to "optical" signals (or light) and "optical" components. However, optoelectronic assembly 100 with PIC 134, as described herein, are not limited to operating with electromagnetic signals of optical spectrum and descriptions provided herein with reference to optical signals and/or optical components are equally applicable to electromagnetic signals of any suitable wavelength, such as electromagnetic signals in near-infrared (NIR) and/or infrared (IR) bands, as well as electromagnetic signals in the RF and/or microwave bands.

Note that in FIG. 1 and in subsequent figures, interconnects including FLI 136 are shown as aligned at the respective interfaces merely for ease of illustration; in actuality, some or all of them may be misaligned. In addition, there may be other components, such as bond pads, landing pads, metallization, etc. present in the assembly that are not shown in the figures to prevent cluttering. Note that FIG. 1 is intended to show relative arrangements of the components within their assemblies, and that, in general, such assemblies may include other components that are not illustrated (e.g., various interfacial layers or various other components related to optical functionality, electrical connectivity, or thermal mitigation). For example, in some further embodiments, the assembly as shown in FIG. 1 may include more dies along with other electrical components. Additionally, although some components of the assemblies are illustrated in FIG. 1 as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

Figure 2:
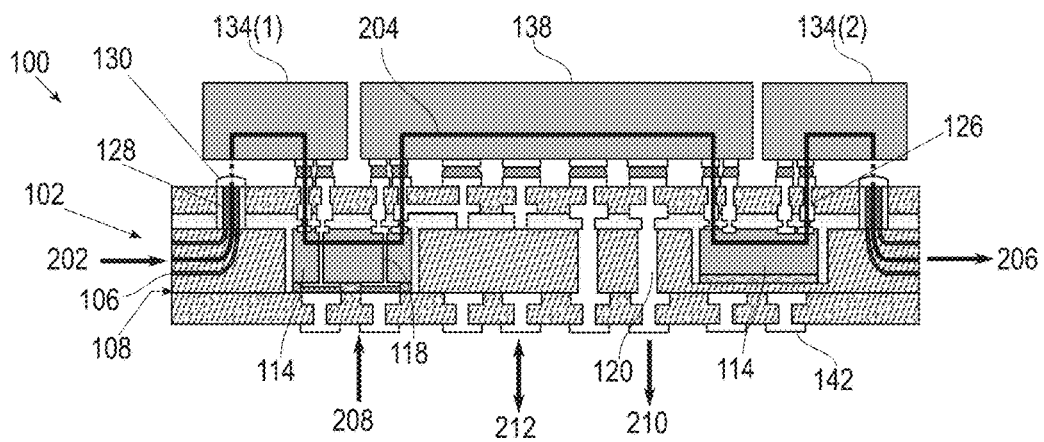
FIG. 2 simplified cross-sectional view of operational details of an example packaging architecture for hybrid electrical and optical communication devices, according to some embodiments of the present disclosure.

FIG. 2 is a simplified cross-sectional view of operational details according to an example embodiment of optoelectronic assembly 100. During operation, an optical signal 202 may be provided to waveguide 106 on side 108. Waveguide 106 may rotate optical signal 202 by 90 degrees, enabling it to traverse optical via 128 and be focused by optical lens 130 into a suitable receiver (not shown) in PIC 134(1). PIC 134(1) may convert optical signal 202 to an electrical signal 204, which may then be communicated to EIC 138 through IC die 114. EIC 138 may process electrical signal 204 appropriately and send it to PIC 134(2). PIC 134(2) may convert electrical signal 204 to an output optical signal 206, which is then transmitted through waveguide 106 in core 104 and out of optoelectronic assembly 100, for example, through appropriate optical fibers connected thereto.

PIC 134 (including PIC 134(1) and 134(2)) and EIC 138 may receive power 208 from a package substrate (not shown) through MLI 142 and TSV 118 in IC die 114 and/or TGV 120. In some embodiments, ground connection 210 may also be facilitated through MLI 142 and TSV 118 and/or TGV 120 as appropriate. PIC 134 and EIC 138 may also receive various electrical signals 212 from the package substrate through MLI 142 and TSV 118 and/or TGV 120 as appropriate. The choice of TSV 118 or TGV 120 for power, ground and signals may be dictated by any suitable criteria, including convenience as well as electrical considerations, such as noise, resistance, and the like. Electrical signals 212 may include, by way of example and not as limitations, control signals, configuration information, status signals, etc., which may permit PIC 134 and EIC 138 to perform their intended functions appropriately.

In the example embodiment shown, PIC 134(2) is indicated to be different from PIC 134(1). However, in other embodiments, the same PIC, e.g., PIC 134(1) that sends the input signal to EIC 138 may receive the output signal and function equivalently to PIC 134(2). Further, in the example embodiment, PIC 134(2) which receives the output signal is shown located on one side of EIC 138 whereas PIC 134(1) which sends the input signal is shown located on an opposing side of EIC 138. However, in other embodiments, both PIC 134(1) and 134(2) may be located on the same side of EIC 138. Although only PIC 134 and EIC 138 are shown in the figure, any number of additional components, including active and passive elements may be coupled to substrate 102 and perform respective functions for the intended operation of optoelectronic assembly 100.

According to various embodiments, core 104 and waveguide 106 enable efficient optical communication in a 2.5D or 3D packaging architecture. Glass being dimensionally stable provides a suitable bulk material and surface for forming an efficient in situ waveguide. In addition, the use of glass material in substrate 102 enables fine pitch in FLI 136 and MLI 142, which could translate to higher performing products. The shape of waveguide 106 enables routing optical signals (e.g., 202, 206) between two orthogonal sides (e.g., 108 and 132), such that optical signals presented to optoelectronic assembly 100 at side 108 may be processed by PIC 134 located on orthogonal side 132 and vice versa.

Figure 3:
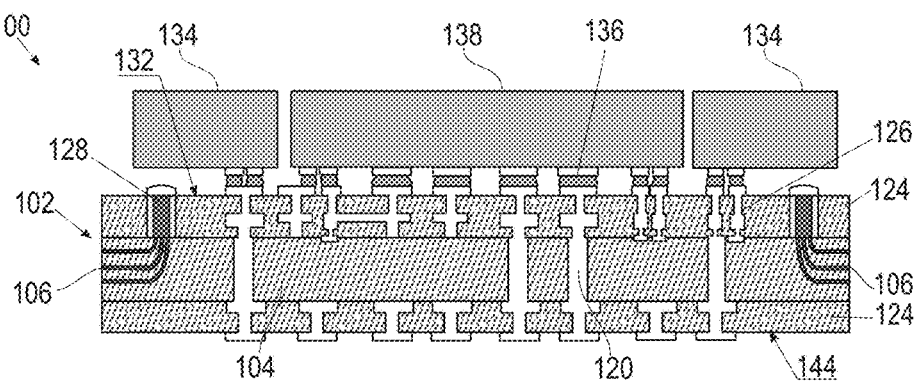
FIG. 3 simplified cross-sectional view of structural details of another example packaging architecture for hybrid electrical and optical communication devices, according to some embodiments of the present disclosure.

FIG. 3 is a simplified cross-sectional view of an optoelectronic assembly 100 according to an example embodiment. In the example embodiment, core 104 of substrate 102 may not comprise any cavity 112 housing IC die 114. All electrical interconnection between side 132 and side 144 of substrate 102 may be accomplished with TGVs 120 suitably. Lateral electrical coupling between PIC 134 and EIC 138 may be accomplished with conductive traces 126 in second dielectric 124 suitably. Such embodiments may be used where lateral electrical interconnection speed between PIC 134 and EIC 138 can be less than speeds provided by silicon-level interconnects of IC die 114. Such embodiments may also be used where TSVs 118 are not required for performance or other considerations. Due to the absence of cavity 112, first dielectric 122 may be dispensed with entirely, and replaced with second dielectric 124. The embodiments presented in FIG. 3 may be cheaper to manufacture and hence desirable in certain low-cost applications.

Figure 4:
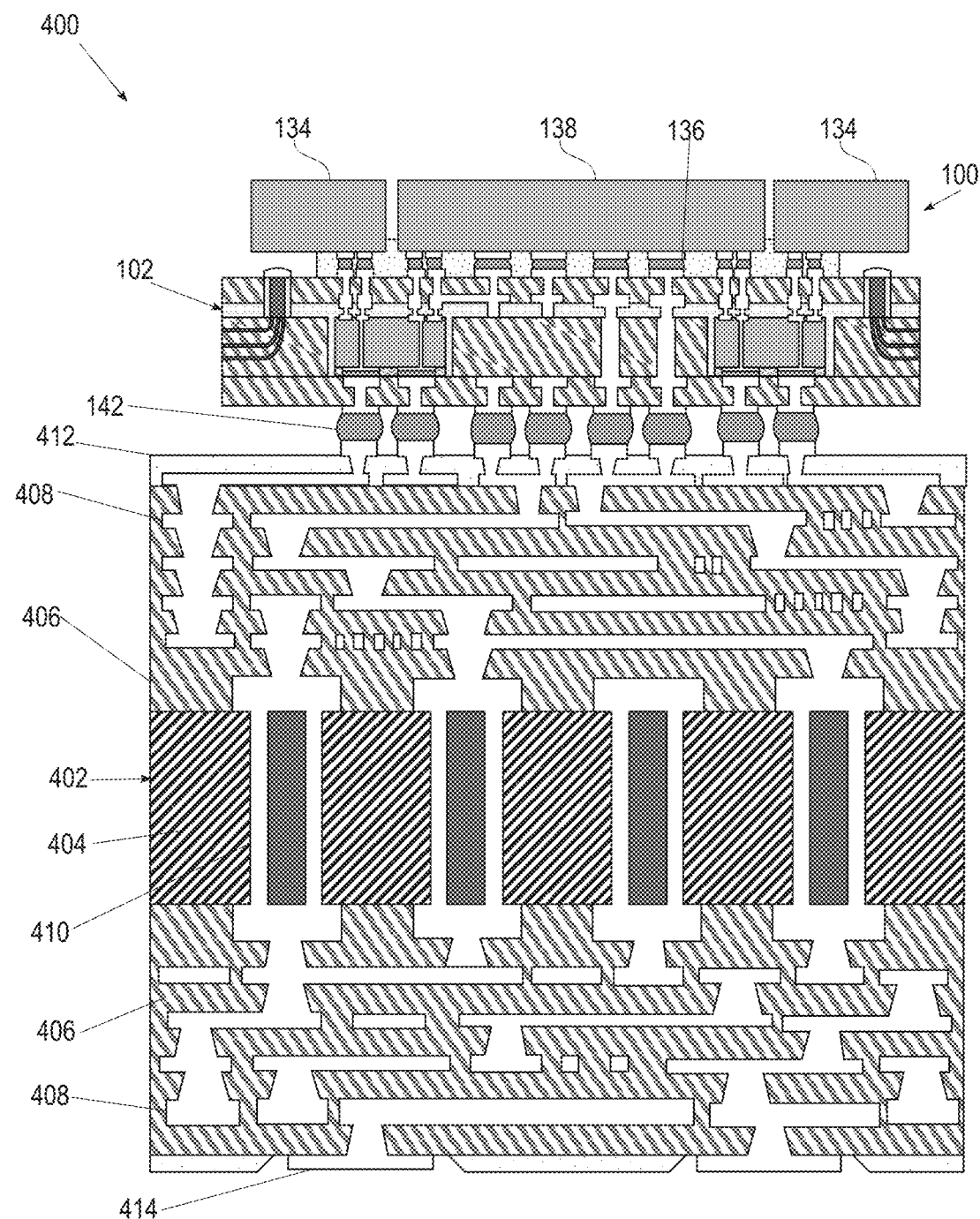
FIG. 4 simplified cross-sectional view of structural details of yet another example packaging architecture for hybrid electrical and optical communication devices, according to some embodiments of the present disclosure.

FIG. 4 is a simplified cross-sectional view of an optoelectronic package 400 which includes optoelectronic assembly 100 according to an example embodiment. Optoelectronic assembly 100 (e.g., as described with reference to FIG. 1) may be coupled with MLI 142 to a package substrate 402. Package substrate 402 may comprise a core 404 with insulator 406 and conductive pathways 408 on either side. In various embodiments, conductive pathways 408 may be formed in metal layers alternating with insulating layers comprising insulator 406 and vias through the insulating layers. In some embodiments, core 404 may comprise glass fiber reinforced epoxy, such as fire-retardant grade 4 (FR-4) glass epoxy with thin copper foil laminated on either side. In some embodiments, core 404 may additionally include prepreg. In particular, when package substrate 402 is formed using standard PCB processes, package substrate 402 may include FR-4, and conductive pathways 408 may be formed by patterned sheets of copper separated by built-up layers of epoxy resin such as FR-4 comprising insulator 406.

In some embodiments, insulator 406 may comprise ABF. In other embodiments, insulator 406 may comprise bismaleimide-triazine (BT) resin, polyimide materials, glass reinforced epoxy matrix materials, organic dielectrics with inorganic fillers or low-k and ultra low-k dielectric (e.g., carbon-doped dielectrics, fluorine-doped dielectrics, porous dielectrics, and organic polymeric dielectrics). Conductive pathways 408 may comprise copper (or other conductive metal) traces, lines, pads, vias, via pads, holes and/or planes (e.g., power and ground planes). Conductive pathways 408 may be bordered by liner materials, such as adhesion liners and/or barrier liners, as suitable.

In some embodiments, package substrate 402 may be formed using a lithographically defined via packaging process. In some embodiments, package substrate 402 may be manufactured using standard organic package manufacturing processes, and thus package substrate 402 may take the form of an organic package. Any method known in the art for fabrication of package substrate 402 may be used, and for the sake of brevity, such methods will not be discussed in further detail herein.

In various embodiments, package substrate 402 may comprise inductors 410 embedded therein. Inductors 410 may comprise coaxial magnetic inductors layer (MIL) structure embedded within core 404 of package substrate 402. In some embodiments, the coaxial MIL structure may include a copper-lined plated through-hole (PTH) surrounded by a high permeability magnetic material such as magnetic resin. The magnetic resin may further include ferrite particle fillers. In various embodiments, the magnetic materials of inductors 410 may include one of more ferromagnetic (or ferrimagnetic) materials, including (but not limited to), cobalt, iron, iron oxide (e.g., ferric oxide and/or ferrous oxide), oxides and other compounds of iron, nickel, copper, magnesium, manganese, bismuth, antimony, yttrium, chromium, arsenic, cadmium, zinc, telluride (e.g., $FeOFe_2O_3$, NiO, CuO, MgO, $CuOFe_2O_3$, $MgOFe_2O_3$, $Y_3Fe_5O_{12}$, MnSb, $CrO_2$, MnAs, CdZnTe).

In various embodiments, a protective coating 412, such as solder-resist or other conformal coating layer may be included on either side of package substrate 402. Examples of the materials comprising protective coating 412 include epoxy, dry-film photoimageable solder mask, acrylic resin, urethane resin, silicone resin, etc.

SLI 414 on a side of package substrate 402 opposite to optoelectronic assembly 100 may facilitate coupling to other parts of an electronic system, such as a mother board or other PCB (not shown). SLI 414 disclosed herein may take any suitable form, including DTPS interconnects as discussed above. In other embodiments, SLI 414 may comprise solder balls in a ball grid array arrangement, pins in a pin grid array arrangement or lands in a land grid array arrangement. The PCB may have other components attached to it. The PCB may include conductive pathways and other conductive contacts for routing power, ground, and signals through the circuit board, as known in the art. In some embodiments, SLI 414 may not couple package substrate 402 to a PCB but may instead couple package substrate 402 to another IC package, or any other suitable component.

In packages as described herein, some or all of FLI 136 and/or MLI 142 may have a finer pitch than SLI 414. In some embodiments, SLI 414 may have a pitch between about 500 micrometer and 1000 micrometer, while MLI 142 may have a pitch between 50 micrometer and 100 micrometer, and FLI 136 may have a pitch between about 0.7 micrometer and 100 micrometer.

In various embodiments, any of the features discussed with reference to any of FIGS. 1-4 herein may be combined with any other features to form a package with one or more ICs as described herein, for example, to form a modified optoelectronic assembly 100. Some such combinations are described above, but, in various embodiments, further combinations and modifications are possible.

Example Methods

Figure 5A:
FIG. 5 simplified cross-sectional view illustrating manufacturing steps of an example packaging architecture for hybrid electrical and optical communication devices, according to some embodiments of the present disclosure.

FIGS. 5A-5E are simplified cross-sectional views of manufacturing steps in the fabrication of optoelectronic assembly 100 according to an embodiment of the present disclosure. FIG. 5A illustrates a glass panel 502 attached to a carrier 504. Carrier 504 may be of any suitable material known in the art, including metal, ceramic and the like. In various embodiments, glass panel 502 may be 510×515 square millimeters in area and around 100-800 micrometer thick. In some embodiments, glass panel 502 may be thicker than 800 micrometer, and may be thinned to within 100-800 micrometer during various manufacturing steps.

Figure 5B:
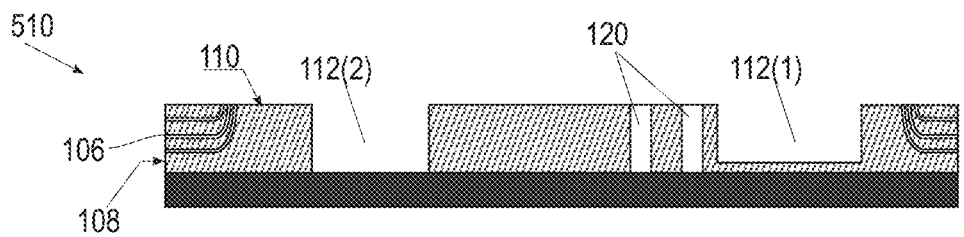

FIG. 5B illustrates an assembly 510 after a series of manufacturing processes have been completed on glass panel 502. For example, DLW processes have been used to generate waveguide 106 that terminate on side 108 and side 110 of glass panel 502. Cavity 112 (e.g., blind cavity 112(1) and through-hole 112(2)) may be etched into glass panel 502. Vias for TGVs 120 may be formed in glass panel 502. In various embodiments, cavity 112 and vias for TGVs 120 may be formed by laser sensitizing followed by etching with hydrofluoric acid (HFI). Any known process for forming holes and vias in glass may be used to generate cavity 112 and vias for TGVs 120 as appropriate. In various embodiments, the vias may be filled with copper (or other conductive metal) to generate TGVs 120.

Figure 5C:
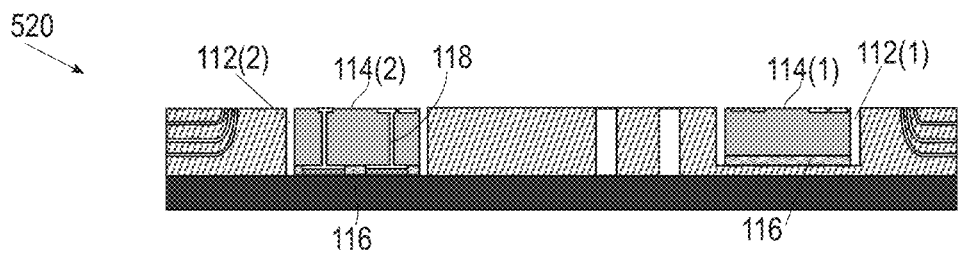

FIG. 5C illustrates an assembly 520 after another series of manufacturing processes. For example, IC die 114 (e.g., bridge die 114(1) and IC die 114(2)) with TSVs 118 may be attached within cavity 112 using die attach adhesive 116. In various embodiments, pick and place machines may accurately place die 114 in cavity 112 suitably.

Figure 5D:
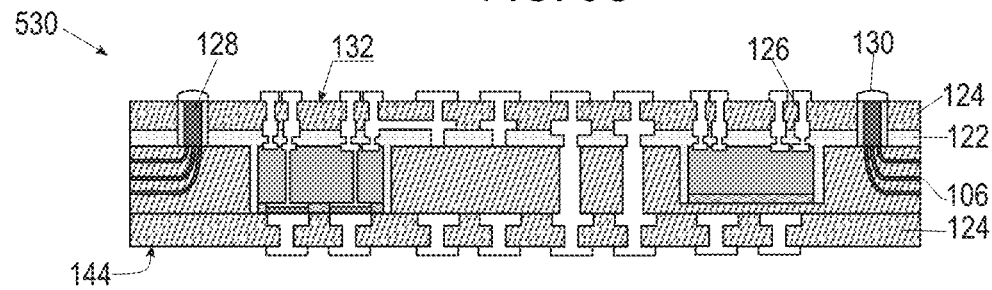

FIG. 5D illustrates an assembly 530 after further manufacturing processes are completed. First dielectric 122 may be deposited on glass panel 502 such that cavity 112 is filled up suitably and side 110 is encapsulated. Second dielectric 124 along with conductive traces 126 (e.g., traces and vias), may be formed on either side of glass panel 502. During this process, glass panel 502 becomes embedded within material layers thereby forming core 104. Carrier 504 may be removed for these processes as appropriate. Optical via 128 may be formed in first dielectric 122 and second dielectric 124 to align with waveguide 106, thus completing formation of substrate 102. In various embodiments, optical via 128 may be formed by any suitable method for making vias in organic materials, including laser drilling, dry or wet etching, etc.

Figure 5E:
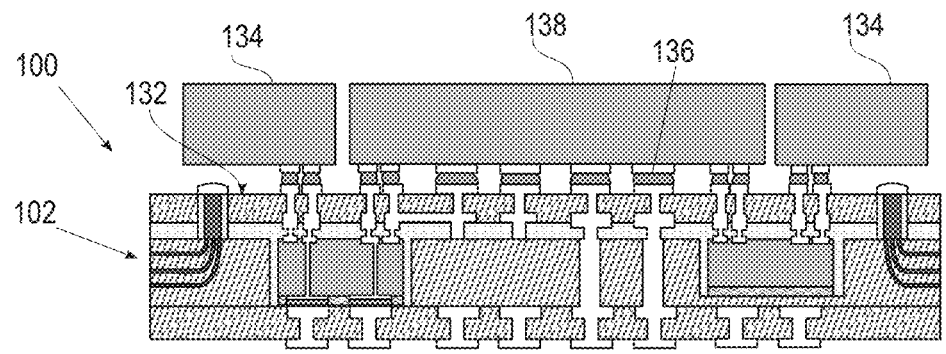

FIG. 5E illustrates optoelectronic assembly 100 after completion of manufacture, including attaching PIC 134 and EIC 138 with FLI 136 to substrate 102 and dicing and separating individual assemblies from the panel. The process of attaching PIC 134 and EIC 138 to substrate 102 may depend on the type of FLI 136. For example, in embodiments where FLI 136 is solder-based, solder paste may be applied to conductive contacts (e.g., bond pads) on substrate 102 and/or PIC 134 and EIC 138 and the assembly subjected to a solder reflow process. In embodiments where FLI 136 comprises hybrid bonds, PIC 134 and EIC 138 may be placed on substrate 102 such that their mating conductive contacts (e.g., bond pads) are aligned and the assembly subjected to heating and pressurizing processes, during which materials on the contacting surfaces may bond together appropriately.

Figure 6:
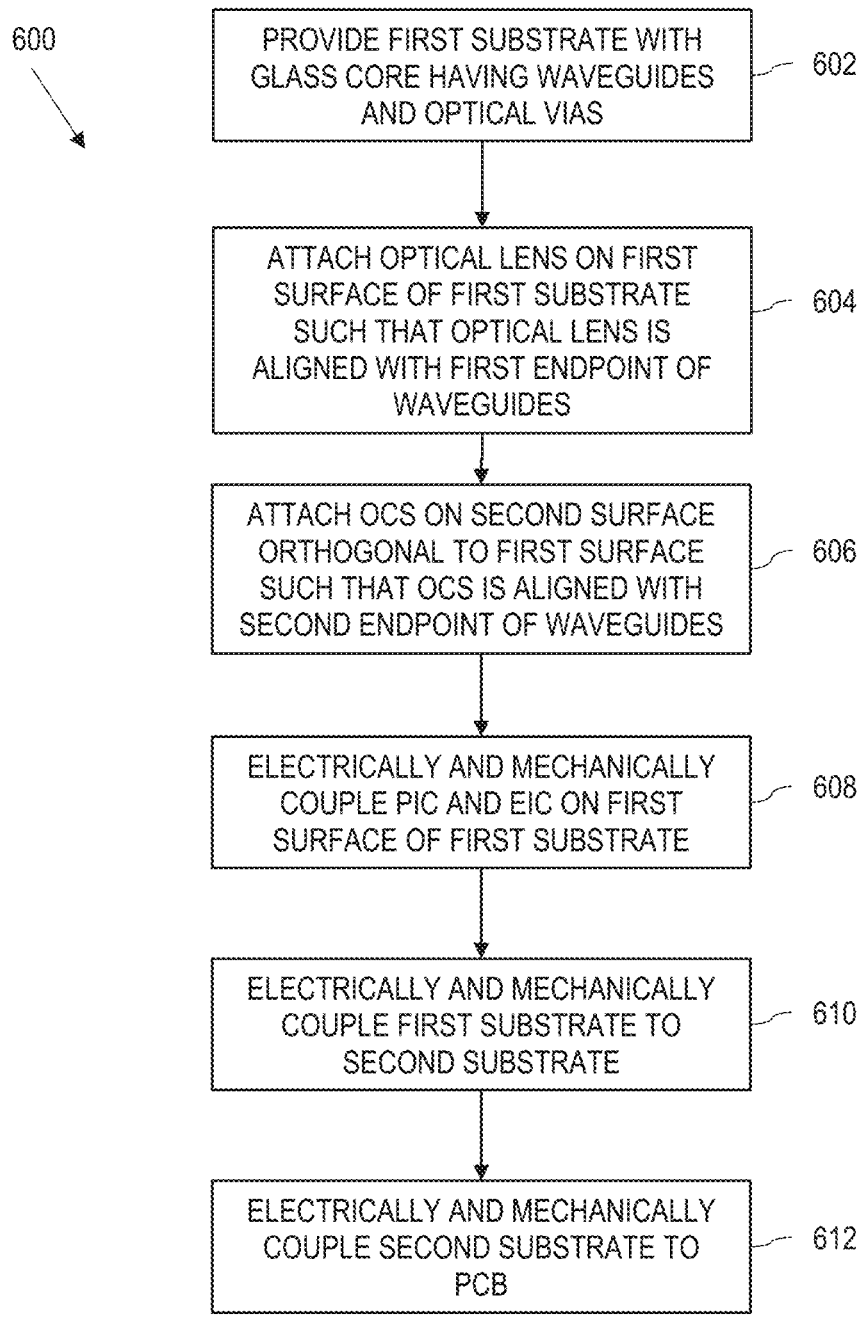
FIG. 6 is a flow diagram illustrating operations with an example packaging architecture for hybrid electrical and optical communication devices, according to an embodiment of the present disclosure.

FIG. 6 is a flow diagram illustrating example operations 600 associated with assembling optoelectronic assembly 100 according to various embodiments. At 602, a first substrate (e.g., substrate 102) may be provided having core 104 with waveguide 106 and optical via 128. In various embodiments, waveguide 106 may be formed using a DLW process known in the art. The contour and/or structure of waveguide 106 may be dictated by process parameters used during the DLW process. In a general sense, waveguide 106 may be configured (e.g., shaped) suitably so as to route optical signals between two orthogonal sides of substrate 102. In various embodiments, optical via 128 may be formed by an etching process followed by filling with transparent epoxy. At 604, optical lens 130 is attached to a first side (e.g., side 132) of substrate 102 such that optical lens 130 is aligned with a first endpoint of waveguide 106 terminating on side 110 of core 104 parallel to side 132. In various embodiments, optical lens 130 is further aligned with optical via 128 located between side 110 of core 104 and side 132 of substrate 102.

At 606, OCS 146 is attached to a second side (e.g., side 108) of substrate 102 such that OCS 146 is aligned with a second endpoint of waveguide 106 terminating on side 108. At 608, PIC 134 and EIC 138 are electrically and mechanically coupled on side 132 of substrate 102. In various embodiments, such electrical and mechanical coupling may be accomplished using FLI 136. At 610, substrate 102 is electrically and mechanically coupled to a second substrate (e.g., package substrate 402). In various embodiments, the electrical and mechanical coupling between substrate 102 and package substrate 402 may be accomplished using MLI 142. At 612, package substrate 402 is electrically and mechanically coupled to a PCB (e.g., motherboard). In various embodiments, the electrical and mechanical coupling between package substrate 402 and the PCB may be accomplished using SLI 414.

Although FIGS. 5A-5E and FIG. 6 illustrate various operations performed in a particular order, this is simply illustrative, and the operations discussed herein may be reordered and/or repeated as suitable. For example, one or more operations may be performed in parallel to manufacture multiple optoelectronic assemblies substantially simultaneously. In another example, the operations may be performed in a different order to reflect the structure of a particular optoelectronic assembly. Numerous other variations are also possible to achieve the desired structure of optoelectronic assembly 100. Further, additional processes which are not illustrated may also be performed without departing from the scope of the present disclosure. For example, the operations may include various cleaning operations, surface planarization operations (e.g., using CMP), operations for surface roughening, operations to include barrier and/or adhesion layers as desired, and/or operations for incorporating packages as described herein in, or with, an IC die, a computing device, or any desired structure or device. Also, various ones of the operations discussed herein with respect to FIGS. 4A-4E and FIG. 5 may be modified in accordance with the present disclosure to fabricate others of optoelectronic assembly 100 disclosed herein.

Example Devices and Components

Figure 7:
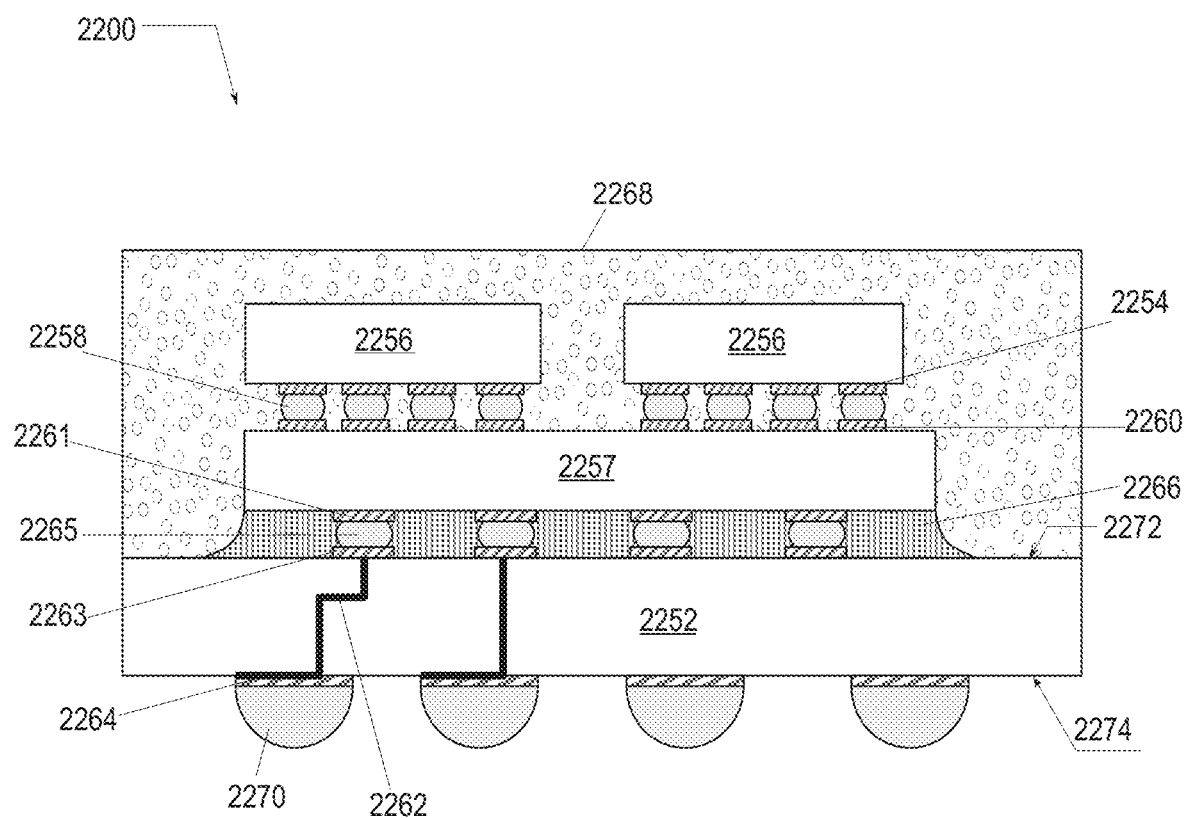
FIG. 7 is a cross-sectional view of a device package that may include one or more optoelectronic assemblies in accordance with any of the embodiments disclosed herein.
Figure 8:
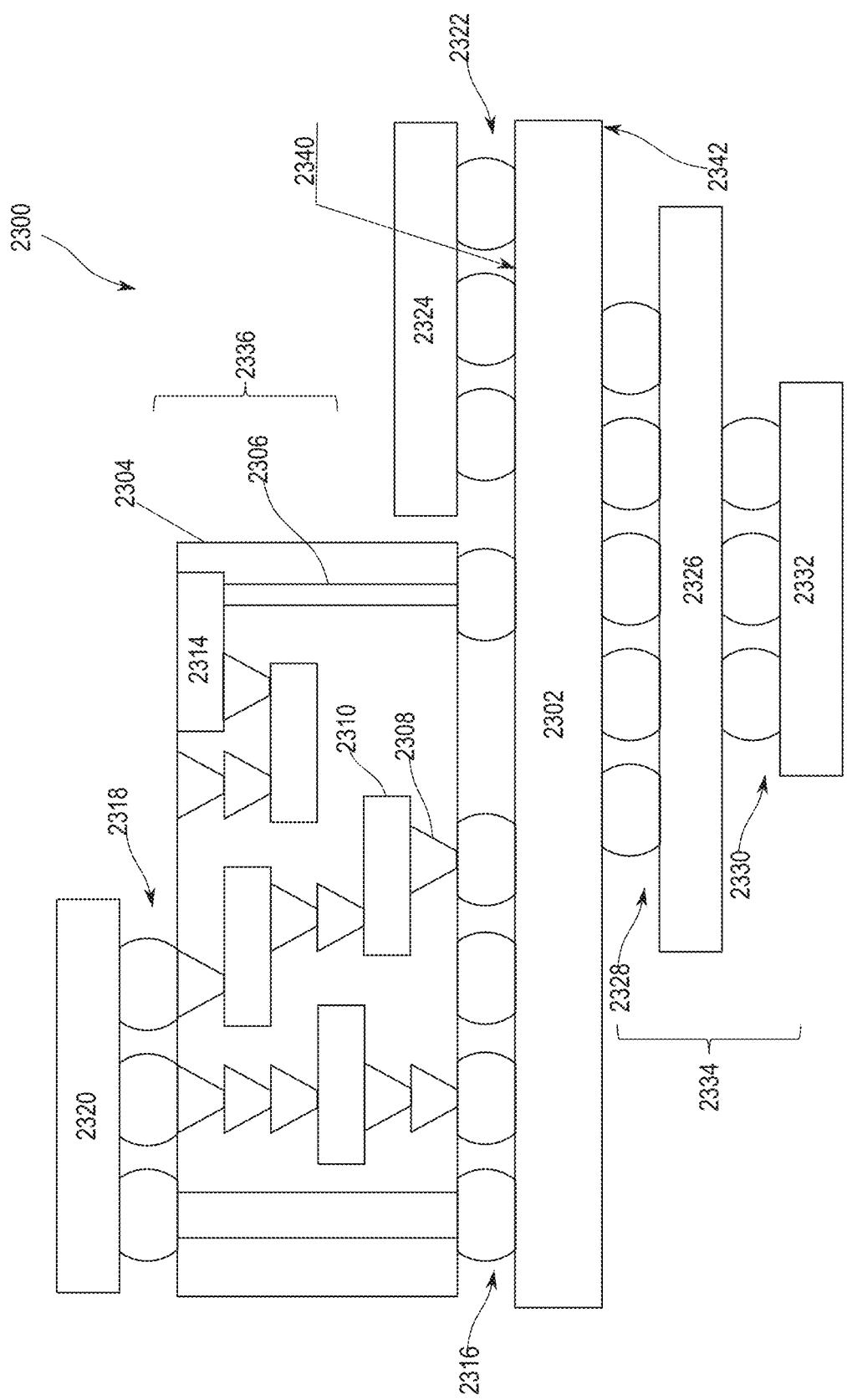
FIG. 8 is a cross-sectional side view of a device assembly that may include one or more optoelectronic assemblies in accordance with any of the embodiments disclosed herein.
Figure 9:
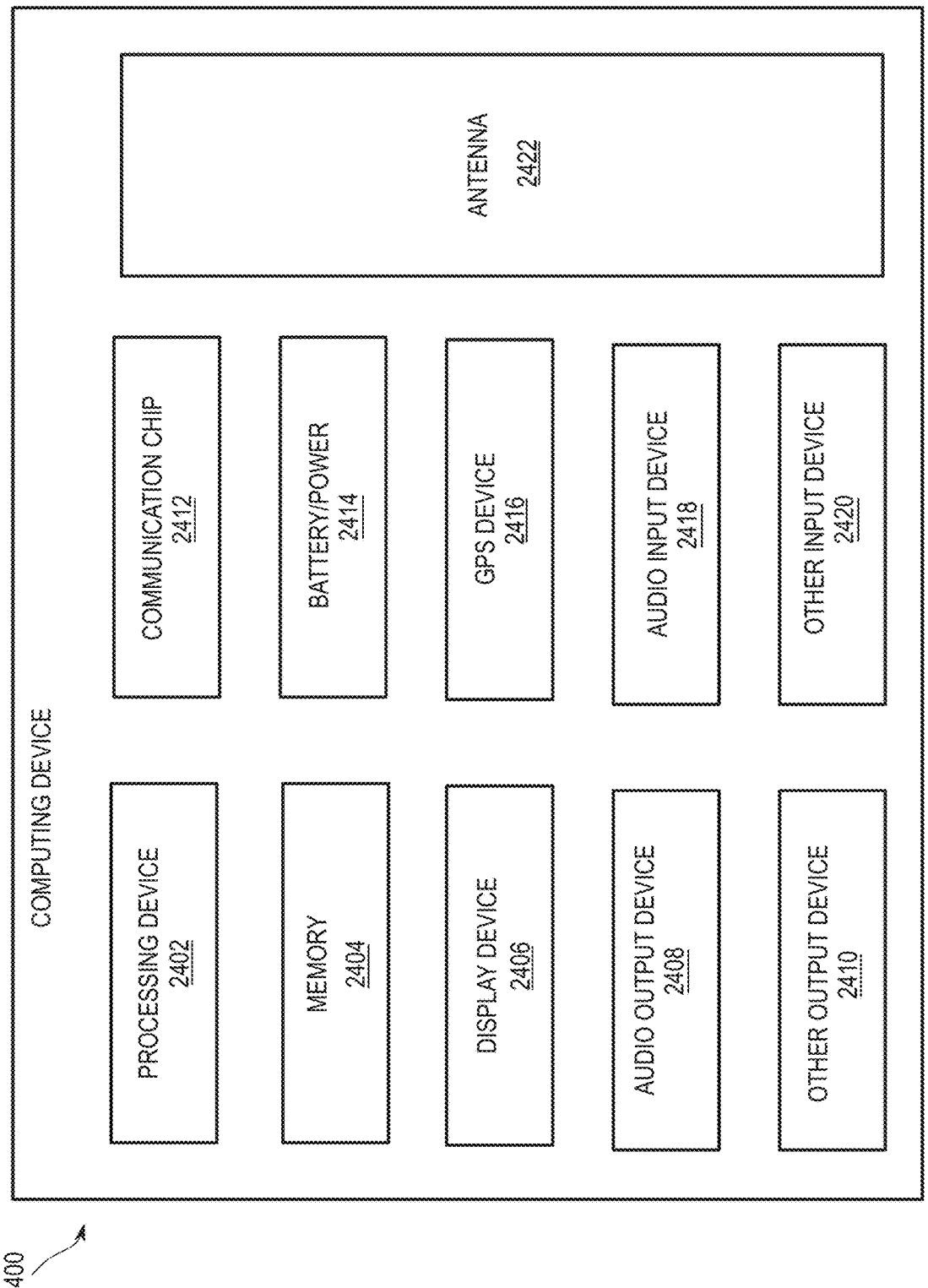
FIG. 9 is a block diagram of an example computing device that may include one or more optoelectronic assemblies in accordance with any of the embodiments disclosed herein.

The packages disclosed herein, e.g., any of the embodiments shown in FIGS. 1-9 or any further embodiments described herein, may be included in any suitable electronic component. FIGS. 7-9 illustrate various examples of packages, assemblies, and devices that may be used with or include any of the IC packages as disclosed herein.

FIG. 7 is a side, cross-sectional view of an example IC package 2200 that may include optoelectronic assemblies in accordance with any of the embodiments disclosed herein. In some embodiments, the IC package 2200 may be a system-in-package (SiP).

As shown in FIG. 7, package support 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias, e.g., as discussed above with reference to FIG. 1.

Package support 2252 may include conductive contacts 2263 that are coupled to conductive pathway 2262 through package support 2252, allowing circuitry within dies 2256 and/or interposer 2257 to electrically couple to various ones of conductive contacts 2264 (or to other devices included in package support 2252, not shown).

IC package 2200 may include interposer 2257 coupled to package support 2252 via conductive contacts 2261 of interposer 2257, FLI 2265, and conductive contacts 2263 of package support 2252. FLI 2265 illustrated in FIG. 7 are solder bumps, but any suitable FLI 2265 may be used, such as solder bumps, solder posts, or bond wires.

IC package 2200 may include one or more dies 2256 coupled to interposer 2257 via conductive contacts 2254 of dies 2256, FLI 2258, and conductive contacts 2260 of interposer 2257. In various embodiments, interposer 2257 may include core 104 with waveguide 106 as described herein. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). FLI 2258 illustrated in FIG. 7 are solder bumps, but any suitable FLI 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package support 2252 and interposer 2257 around FLI 2265, and mold 2268 may be disposed around dies 2256 and interposer 2257 and in contact with package support 2252. In embodiments wherein one or more of dies 2256 comprise PICs such as PIC 134, mold 2268 may have voids, optical vias, spaces or cavities therein to permit optical signals to pass between the dies and interposer 2257. In some embodiments, underfill material 2266 may be the same as mold 2268. Example materials that may be used for underfill material 2266 and mold 2268 are epoxies as suitable. SLI 2270 may be coupled to conductive contacts 2264. SLI 2270 illustrated in FIG. 7 are solder balls (e.g., for a ball grid array (BGA) arrangement), but any suitable SLI 2270 may be used (e.g., pins in a pin grid array arrangement or lands in a land grid array arrangement). SLI 2270 may be used to couple IC package 2200 to another component, such as a circuit board (e.g., a motherboard), an interposer, or another IC package, as known in the art and as discussed below with reference to FIG. 8.

In embodiments in which IC package 2200 includes multiple dies 2256, IC package 2200 may be referred to as a multi-chip package (MCP). Dies 2256 may include circuitry to perform any desired functionality. For example, besides one or more of dies 2256 comprising components of PIC 134 or EIC 138 as described herein, one or more of dies 2256 may be logic dies (e.g., silicon-based dies), one or more of dies 2256 may be memory dies (e.g., high-bandwidth memory), etc. In some embodiments, at least some of dies 2256 may not include components of PIC 134 or EIC 138 as described herein.

Although IC package 2200 illustrated in FIG. 7 is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package support 2252, or on either face of interposer 2257. More generally, IC package 2200 may include any other active or passive components known in the art.

FIG. 8 is a cross-sectional side view of an IC device assembly 2300 that may include components having one or more optoelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more optoelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 7.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package support.

FIG. 8 illustrates that, in some embodiments, IC device assembly 2300 may include a package-on-interposer structure 2336 coupled to first face 2340 of circuit board 2302 by coupling components 2316. Although not shown so as not to clutter the drawing, package-on-interposer structure 2336 may comprise a glass core, such as core 104 in some embodiments. In other embodiments, package-on-interposer structure 2336 may not comprise any glass core. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. In some embodiments, IC package 2320 may comprise optoelectronic assembly 100, including substrate 102 with core 104, PIC 134, EIC 138 and other components as described herein, which are not shown so as not to clutter the drawing. Coupling components 2318 may take any suitable form depending on desired functionalities, such as the forms discussed above with reference to coupling components 2316. In some embodiments, IC package 2320 may be or include IC package 2200, e.g., as described above with reference to FIG. 7.

Although a single IC package 2320 is shown in FIG. 8, multiple IC packages may be coupled to interposer 2304; indeed, additional interposers may be coupled to interposer 2304. Interposer 2304 may provide an intervening package support used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in FIG. 8, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including TSVs 2306. Interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 9 is a block diagram of an example computing device 2400 that may include one or more components having one or more IC packages in accordance with any of the embodiments disclosed herein. For example, any suitable ones of the components of computing device 2400 may include optoelectronic assembly 100 including substrate 102 having core 104 and waveguide 106 in accordance with any of the embodiments disclosed herein. In another example, any one or more of the components of computing device 2400 may include any embodiments of IC package 2200 (e.g., as shown in FIG. 7). In yet another example, any one or more of the components of computing device 2400 may include an IC device assembly 2300 (e.g., as shown in FIG. 8).

A number of components are illustrated in FIG. 9 as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SOC die.

Additionally, in various embodiments, computing device 2400 may not include one or more of the components illustrated in FIG. 9, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more digital signal processors (DSPs), ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips; note that the terms "chip," "die," and "IC die" are used interchangeably herein). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives of it, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

SELECT EXAMPLES

The following paragraphs provide various examples of the embodiments disclosed herein.

Example 1 provides an optoelectronic assembly (e.g., 100 of FIG. 1) comprising: a substrate (e.g., 102) having a core (e.g., 104) comprised of glass; and a PIC (e.g., 134) and an electronic IC (EIC) (e.g., 138) coupled to a first side (e.g., 132) of the substrate. The core comprises a waveguide (e.g., 106) with a first endpoint proximate to the first side and a second endpoint exposed on a second side (e.g., 108) of the substrate, and the first side is orthogonal to the second side.

Example 2 provides the optoelectronic assembly of example 1, in which the first endpoint of the waveguide is on a third side (e.g., 110) of the core parallel to the first side of the substrate, the substrate further comprises an optical via aligned with the first endpoint of the waveguide, and the optical via extends between the first side and the third side.

Example 3 provides the optoelectronic assembly of example 2, in which the waveguide has a first refractive index and the glass of the core has a second refractive index different from the first refractive index.

Example 4 provides the optoelectronic assembly of any of examples 2-3, in which the waveguide is of any shape that can be inscribed by a laser between the endpoint on the second side and the another endpoint on the third side.

Example 5 provides the optoelectronic assembly of any of examples 2-4, further comprising an optical lens (e.g., 130) attached to the substrate on the first side. The optical lens is aligned with the optical via and configured to focus the optical signals between the optical via and the PIC.

Example 6 provides the optoelectronic assembly of example 5, in which the optical lens comprises a lens array.

Example 7 provides the optoelectronic assembly of any of examples 1-6, wherein an optical coupling structure (OCS) (e.g., 146) comprising an optical fiber is coupled to the second side and aligned with the exposed second endpoint of the waveguide.

Example 8 provides the optoelectronic assembly of any of examples 1-7, in which the waveguide is fabricated using direct laser writing (DLW).

Example 9 provides the optoelectronic assembly of any of examples 1-8, in which the substrate further includes alternating layers of dielectric and conductive traces on either side of the core.

Example 10 provides the optoelectronic assembly of example 9, in which the conductive traces provide electrical coupling between the PIC and the EIC (e.g., FIG. 3).

Example 11 provides the optoelectronic assembly of any of examples 1-10, in which the substrate further includes a through-glass-via (TGV) (e.g., 120) through the core configured to provide electrical coupling between the first side and a fourth side (e.g., 144) of the substrate opposite to the first side.

Example 12 provides the optoelectronic assembly of any of examples 1-11, in which: the core further comprises a cavity (e.g., 112), an IC die (e.g., 114) is in the cavity, and the IC die provides electrical coupling between the PIC and the EIC (e.g., FIG. 1).

Example 13 provides the optoelectronic assembly of example 12, in which the cavity is a blind cavity (e.g., 112(1)).

Example 14 provides the optoelectronic assembly of example 12, in which the cavity is a through-cavity (e.g., 112(2)).

Example 15 provides the optoelectronic assembly of any of examples 12-14, in which the substrate further includes a dielectric (e.g., 122) encapsulating the core.

Example 16 provides the optoelectronic assembly of example 15, in which the dielectric fills any space around the IC die in the cavity.

Example 17 provides the optoelectronic assembly of any of examples 12-16, in which the IC die is attached to the core with an adhesive (e.g., 116).

Example 18 provides the optoelectronic assembly of any of examples 12-17, in which the IC die comprises through-silicon vias (TSVs) (e.g., 118) configured to provide electrical coupling between the first side of the substrate and a fourth side (e.g., 144) of the substrate opposite to the first side.

Example 19 provides the optoelectronic assembly of any of examples 12-18, in which the IC die is a passive die without any active elements.

Example 20 provides the optoelectronic assembly of any of examples 12-19, in which the IC die comprises active elements.

Example 21 provides the optoelectronic assembly of any of examples 1-20, in which the PIC and the EIC are coupled to the substrate with first-level interconnects (FLI) (e.g., 136).

Example 22 provides the optoelectronic assembly of example 21, in which the substrate is a first substrate coupled to a second substrate (e.g., 402) with mid-level interconnects (MLI) (e.g., 142) (e.g., FIG. 4).

Example 23 provides the optoelectronic assembly of example 22, in which a first pitch of the FLI is smaller than a second pitch of the MLI.

Example 24 provides the optoelectronic assembly of example 22, in which a first pitch of the FLI is same as a second pitch of the MLI.

Example 25 provides the optoelectronic assembly of any of examples 22-24, in which the first substrate is smaller than the second substrate.

Example 26 provides the optoelectronic assembly of example 22, in which the second substrate comprises a core of organic material surrounded by alternating layers of insulator and conductive pathways.

Example 27 provides the optoelectronic assembly of any of examples 22-26, in which the second substrate is coupled to a PCB with second-level interconnects (SLI) (e.g., 414).

Example 28 provides the optoelectronic assembly of example 27, in which a first pitch of the FLI is smaller than a second pitch of the MLI, and the second pitch of the MLI is smaller than a third pitch of the SLI.

Example 29 provides the optoelectronic assembly of any of examples 22-28, further comprising another one of the first substrate coupled to the second substrate.

Example 30 provides the optoelectronic assembly of any of examples 1-29, in which the substrate, the PIC and the EIC together form a sub-system of a larger optoelectronic system.

Example 31 provides a substrate comprising: a core of glass; and alternating layers of dielectric and conductive traces on either side of the core. The core comprises a waveguide having a first endpoint on a first side of the core, and a second endpoint on a second side of the core, and the first side is orthogonal to the second side.

Example 32 provides the substrate of example 31, in which the waveguide is fabricated by a DLW process.

Example 33 provides the substrate of any of examples 31-32, in which the waveguide has a different refractive index than the core.

Example 34 provides the substrate of any of examples 31-33, further comprising an optical via aligned with the waveguide and configured to route optical signals between the waveguide and a third side of the substrate, wherein the third side is parallel to and spaced apart from the second side.

Example 35 provides the substrate of example 34, in which the optical via is configured to interface with an optical lens attached to the second side of the substrate and aligned with the optical via.

Example 36 provides the substrate of any of examples 31-35, in which the dielectric comprises Ajinomoto Buildup Film and the conductive traces comprise copper.

Example 37 provides the substrate of any of examples 31-36, further comprising TGVs through the dielectric and the core. The TGVs electrically couple a third side of the substrate with a fourth side of the substrate opposite to the third side.

Example 38 provides the substrate of example 37, further comprising conductive contacts on the third side configured to couple to a PIC or EIC with FLIs.

Example 39 provides the substrate of any of examples 37-38, further comprising conductive contacts on the fourth side configured to couple to another substrate with MUs.

Example 40 provides the substrate of example 39, in which the another substrate couples to a PCB with SLIs.

Example 41 provides the substrate of any of examples 39-40, in which the substrate is smaller than the another substrate.

Example 42 provides the substrate of any of examples 31-41, in which the core comprises a cavity having an IC die.

Example 43 provides the substrate of example 42, in which the IC die provides electrical coupling between components coupled to the substrate.

Example 44 provides the substrate of example 43, in which the IC die also comprises active elements.

Example 45 provides the substrate of any of examples 43-44, in which the IC die comprises TSVs.

Example 46 provides the substrate of any of examples 43-44, in which the IC die does not have any TSV.

Example 47 provides the substrate of any of examples 42-46, in which the cavity is a blind cavity.

Example 48 provides the substrate of any of examples 42-47, wherein an insulator fills a space around the IC die in the cavity.

Example 49 provides the substrate of any of examples 42-48, in which the IC die is attached to the cavity with an adhesive.

Example 50 provides the substrate of any of examples 42-49, in which the IC die facilitates power, ground and signal connection between components coupled to the substrate.

Example 51 provides a method comprising: providing a substrate with a core comprising glass having a waveguide and an optical via; attaching an optical lens to a first side of the substrate aligned with the optical via; and electrically and mechanically coupling a PIC and an EIC on the first side. The PIC is aligned with the optical lens, the optical via is aligned with a first endpoint of the waveguide proximate to the first side, and a second endpoint of the waveguide is on a second side of the substrate orthogonal to the first side.

Example 52 provides the method of example 51, in which the waveguide is formed in the core by a DLW process.

Example 53 provides the method of any of examples 51-52, in which the optical via is formed in the substrate by an etching process followed by filling with transparent epoxy.

Example 54 provides the method of any of examples 51-53, further comprising attaching an OCS to the second side of the substrate aligned with the second endpoint of the waveguide.

Example 55 provides the method of any of examples 51-54, in which FLIs are used in electrically and mechanically coupling the PIC and the EIC to the substrate.

Example 56 provides the method of any of examples 51-55, in which the substrate is a first substrate, and the method further comprises electrically and mechanically coupling a second substrate to the first substrate.

Example 57 provides the method of example 56, in which MLIs are used in electrically and mechanically coupling the second substrate to the first substrate.

Example 58 provides the method of any of examples 56-57, in which the second substrate is larger than the first substrate.

Example 59 provides the method of any of examples 56-58, further comprising electrically and mechanically coupling the second substrate to a PCB.

Example 60 provides the method of any of examples 56-59, wherein SLIs are used in electrically and mechanically coupling the second substrate to the PCB.

Example 61 provides the method of any of examples 51-60, further comprising: receiving an optical signal at the second endpoint of the waveguide on the second side; routing the optical signal from the second side to the first side; and transmitting the optical signal through the optical lens out of the first side to the PIC.

Example 62 provides the method of any of examples 51-61, further comprising: receiving an optical signal at the optical lens on the first side of the substrate; routing the optical signal from the first side to the second side; and transmitting the optical signal out of the second side of the substrate.

Example 63 provides the method of any of examples 51-62, further comprising providing power, ground, and electrical signals to the PIC and the EIC through the substrate.

Example 64 provides the method of example 63, in which providing power, ground and electrical signals comprises electrically coupling the first side of the substrate with a third side of the substrate opposite to the first side with TGVs.

Example 65 provides the method of example 64, in which the TGVs are formed in the core by etching and subsequent deposition of conductive metal.

Example 66 provides the method of any of examples 63-65, in which providing power, ground and electrical signals comprises electrical coupling using an IC die within a cavity in the core of the substrate.

Example 67 provides the method of example 66, in which the cavity is a blind cavity, the IC die does not have TSVs, and the IC die provides electrical coupling between the PIC and the EIC.

Example 68 provides the method of example 66, in which the cavity is a through-cavity, the IC die has TSVs, the IC die provides electrical coupling between the PIC and the EIC, and the IC die provides electrical coupling between the first side and a third side of the substrate opposite to the first side.

Example 69 provides the method of any of examples 66-68, in which the cavity is formed in the core by an etching process.

Example 70 provides the method of any of examples 66-69, further comprising attaching the IC die inside the cavity using an adhesive.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A substrate comprising:
a core of glass;
alternating layers of dielectric and conductive traces on either side of the core, wherein:
the core comprises a waveguide having a first endpoint on a first side of the core, and a second endpoint on a second side of the core, and
the first side is orthogonal to the second side; and
TGVs through the dielectric and the core, wherein the TGVs electrically couple a third side of the substrate with a fourth side of the substrate opposite to the third side.

2. The substrate of claim 1, further comprising an optical via aligned with the waveguide and configured to route optical signals between the waveguide and the third side of the substrate, wherein the third side is parallel to and spaced apart from the second side.

3. The substrate of claim 1, further comprising:
a first set of conductive contacts on the third side configured to couple to a PIC or EIC with FLIs; and
a second set of conductive contacts on the fourth side configured to couple to another substrate with MLIs, wherein the another substrate couples to a PCB with SLIs.

4. The substrate of claim 1, wherein the core comprises a cavity having an IC die that provides electrical coupling between components coupled to the substrate.

5. The substrate of claim 4, wherein the IC die comprises TSVs.

6. The substrate of claim 3, wherein the substrate is smaller than the another substrate.

7. The substrate of claim 4, wherein the cavity is a blind cavity.

8. The substrate of claim 4, wherein an insulator fills a space around the IC die in the cavity.

9. The substrate of claim 4, wherein the IC die is attached to the cavity with an adhesive.

10. The substrate of claim 4, wherein the IC die facilitates power, ground and signal connection between components coupled to the substrate.

11. A substrate comprising:
a core of glass;
alternating layers of dielectric and conductive traces on either side of the core, wherein:
the core comprises a waveguide having a first endpoint on a first side of the core, and a second endpoint on a second side of the core, and
the first side is orthogonal to the second side;
an optical via aligned with the waveguide and configured to route optical signals between the waveguide and a third side of the substrate, wherein the third side is parallel to and spaced apart from the second side, wherein the optical via is configured to interface with an optical lens attached to the second side of the substrate and aligned with the optical via.

* * * * *